United States Patent
Blässing et al.

(10) Patent No.: US 6,864,113 B2
(45) Date of Patent: Mar. 8, 2005

(54) LUMINOUS DIODE BASED ON SOLUBLE ORGANIC MATERIALS

(75) Inventors: Jörg Blässing, Obukochen (DE); Georg Wittmann, Herzogenaurach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 25 days.

(21) Appl. No.: 10/238,680

(22) Filed: Sep. 11, 2002

(65) Prior Publication Data

US 2003/0059970 A1 Mar. 27, 2003

Related U.S. Application Data

(63) Continuation of application No. PCT/DE01/00948, filed on Mar. 13, 2001.

(30) Foreign Application Priority Data

Mar. 13, 2000 (DE) .......................................... 100 12 205

(51) Int. Cl.[7] .............................................. H01L 21/00
(52) U.S. Cl. ........................................................ 438/30
(58) Field of Search ........................ 438/22, 30; 257/79

(56) References Cited

U.S. PATENT DOCUMENTS

| | | |
|---|---|---|
| 5,858,475 A | 1/1999 | Chiu |
| 5,923,119 A | 7/1999 | Hara et al. |
| 6,103,558 A * | 8/2000 | Yamanaka et al. .......... 438/166 |
| 6,149,257 A * | 11/2000 | Yanaka et al. ................. 347/9 |
| 6,517,213 B1 * | 2/2003 | Fujita et al. .................. 362/84 |

FOREIGN PATENT DOCUMENTS

| | | |
|---|---|---|
| EP | 0 089 221 A | 11/1998 |
| EP | 0 880 303 A1 | 11/1998 |
| WO | WO 92/16023 | 9/1992 |
| WO | WO 99/21233 | 4/1999 |

OTHER PUBLICATIONS

International Search Report, International Application No.: PCT/DE01/00948, Jan. 2, 2002, pp. 1–2.

* cited by examiner

Primary Examiner—Matthew Smith
Assistant Examiner—Calvin Lee
(74) Attorney, Agent, or Firm—Fish & Richardson P.C.

(57) ABSTRACT

According to the present invention at least one layer of an optoelectronic acting material, for example an emitter layer, is applied on a substrate (1) and subsequently dried in accordance with a method for the production of luminous diodes. At least one layer is set vibrating before it is completely dried. This step addresses trapped air and uneven surfaces of the layer.

21 Claims, 1 Drawing Sheet

LUMINOUS DIODE BASED ON SOLUBLE ORGANIC MATERIALS

CROSS REFERENCE TO RELATED APPLICATIONS

The present application is a continuation of International Application PCT/DE01/00948, filed 13 Mar. 2001, and is further based upon and claims the benefit of priority German Application number, 10012205.1, filed Mar. 13, 2000, both of which are herein incorporated by reference.

BACKGROUND OF THE INVENTION

The present invention concerns luminous diode based soluble organic materials and applications thereof. Luminous diodes of this kind are used for example in displays of mobile phones, electronic devices, etc. and inorganic materials have been used often as optoelectronic acting materials. Recently, so too have organic materials, for example polymer, been used. These materials are dissolved, and in particular, suspended in an appropriate solvent; applied in this form on a substrate; and dried. The application of layers is mostly performed today according to the spin-coating-method or standard printing method, for example according to the ink-jet-method. A solvent or suspension of the organic material is spray-coated on the substrate at the first mentioned method, whereby it rotates during or following the coating. The other method works according to the principle of an ink-jet-printer and is particularly suited for the production of pixel structures.

Problems during these and other operations result from so called pin-holes which are produced in and trapped in applied layers. Trappings of air in the original solvents, original suspensions, can only be partially eliminated by freezing out, centrifuging, or ultrasound treatments. However, new trappings of the air are produced during the application of the layers, which have a negative effect on the working life of the luminous diodes. Furthermore, it is problematic with operations where small amounts of material are applied pixel- or line-shaped, to produce a smooth and homogenous surface. In addition, it is difficult to fill out completely and evenly structures prefabricated of photoresist with optoelectronic acting material.

SUMMARY OF THE INVENTION

An advantage of the present invention is directed to method for manufacturing luminous diodes based on soluble organic materials having optoelectronic layers applied in an improved manner over the prior art which further addresses the above set out problems.

These and other advantages are solved by a method wherein optoelectronic layers applied on a substrate are set vibrating before being completely dried. The vibrations may be produced in the optoelectronic layer or applied directly thereto. The vibrations have a two-folded effect on the organic material of the layer. On the one hand already existing trappings of air in the original solvent, produced during the operation, are eliminated. On the other hand the vibrating leads to a smoothing of the surface. Preferably, the optoelectronic layer is set vibrating during the application. It can be useful to continue the vibrating treatment during the drying step as well. The vibrations are produced by ultrasound according to a preferred embodiment of the invention, whereby the substrate to be coated is impinged directly or by a medium with ultrasound. The medium can for example be a rotary table on which the substrate is fastened during spin-coating.

The present invention further comprises a method for the production of luminous diodes, comprising the steps of: vibrating at least one layer of an optoelectronic material, after said material is applied to a substrate and before said material dries.

BRIEF DESCRIPTION OF THE SEVERAL VIEWS OF THE DRAWING

The novel features and method steps believed characteristic of the invention are set out in the claims below. The invention itself, however, as well as other features and advantages thereof, are best understood by reference to the detailed description, which follows, when read in conjunction with the accompanying drawing, wherein:

DETAILED DESCRIPTION OF THE PRESENT INVENTION

Figure 1:
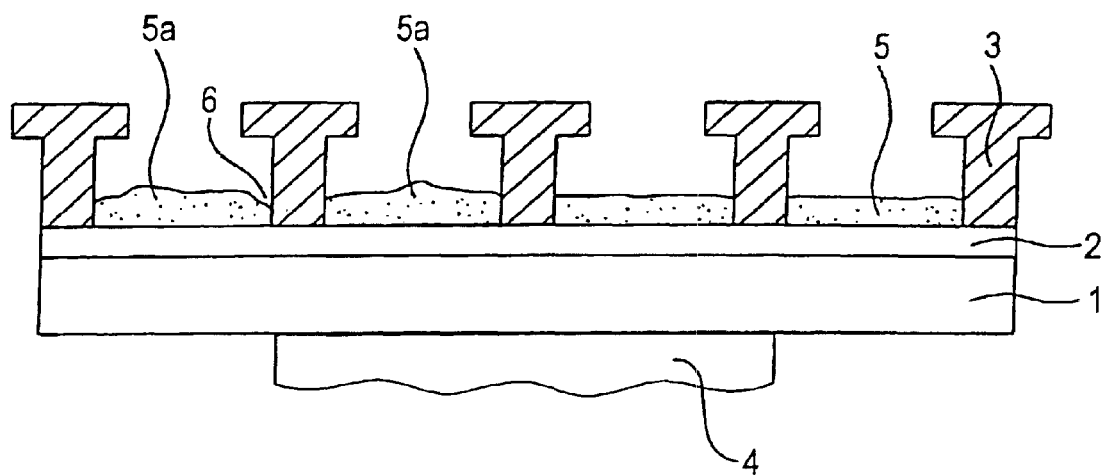
FIG. 1 depicts a first embodiment of the present invention.

The invention is now be set out with respect to two embodiments. FIG. 1 depicts a schematic cross section of a luminous diode wherein an optoelectronic acting layer is composed of a multiple number of parallel stripes. Several channels (2) of ITO (indium/oxide of zinc) are applied collaterally arranged to each other. The channels have a width of approximately 200 $\mu$m to 300 $\mu$m and a spacing of approximately 15 $\mu$m. Photoresist structures 3 are applied vertically to these channels, which, when seen from above, circumscribe stripe-shaped sections. A material is now brought into these sections, for example by an ink-jet system, which produces an electron transport layer. While this layer is being applied and also during the subsequent drying step, the glass substrate 1 is preferably coupled to modulator 4. Ultrasound is transmitted onto the electron transport layer 5 by the ITO channels 2 and the glass substrate. The contained trappings of air rise to the surface and are therefore eliminated from the layer. There is a risk that the trappings of air stay permanently trapped in the layer without an ultrasound impact. The ultrasound impact has a further effect that the surface of the electron transport layer is smoothed. A condition is disclosed in the left half of the drawing, where the electron transport layer 5a shows an uneven surface, If an additional layer is applied on such an uneven surface, there is a risk, that the gaps, particularly the one placed in the border areas between the layer 5a and the photo resist structures, are not filled out so that air trappings can again develop. The disclosed luminous diode in the drawing is further completed by application of an additional optoelectronic material on the electron transport layer 5, which forms an emitter layer (not disclosed). The ultrasound impact leads at this layer too to a removal of the air trappings and a smooth surface. Finally, a metal is sputtered as the last layer, which then forms the cathode.

An ITO layer is initially applied on a transparent substrate and structured in a large-surface manner for the production of a luminous diode with a large-surface optoelectronic coating (not disclosed), i.e. rectangular layer sections with one or several bonding areas are produced to form the ITO anode. The substrate is cleaned after the structuring Subsequently, a water-soluble electron transport layer is applied. The electron transport layer is dried and a polymer dissolved in xylol is applied to form an emitter-layer. The above mentioned spin-coating is used for example for applying both optoelectronic acting layers. The substrate is coupled with a modulator at both the applying and drying steps.

The invention being thus described, it will be obvious that the same may be varied in many ways. Such variations are not to be regarded as a departure from the spirit and scope of the invention. All obvious modifications are intended to be included within the scope of the following claims.

We claim:

1. A method for the production of luminous diodes, comprising the steps of:
    applying onto a substrate at least one layer of a liquid including an optoelectronic material;
    vibrating the at least one layer after applying the at least one layer onto the substrate; and
    drying the at least one layer of the liquid.

2. The method according to claim 1, wherein the steps of applying, vibrating and drying form an emitter layer.

3. The method according to claim 1, wherein said vibrating is effected during application of the at least one layer of the liquid.

4. The method according to claim 3, where said vibrating is effected by ultrasound.

5. The method according to claim 1, where said vibrating is effected by ultrasound.

6. The method according to claim 1, wherein said step of vibrating is performed directly to said substrate.

7. The method according to claim 1, wherein said step of vibrating is performed indirectly to said substrate.

8. The method according to claim 1, wherein the optoelectronic material includes an organic electroluminescent material.

9. The method according to claim 8, wherein the steps of applying, vibrating and drying form an emitter layer.

10. The method according to claim 8, wherein said vibrating is effected during application of the at least one layer of the liquid.

11. The method according to claim 8, where said vibrating is effected by ultrasound.

12. The method according to claim 8, wherein said step of vibrating is performed directly to said substrate.

13. The method according to claim 8, wherein said step of vibrating is performed indirectly to said substrate.

14. The method according to claim 8, wherein the organic electroluminescent material includes a polymer.

15. The method according to claim 8, wherein the at least one liquid includes xylol.

16. The method according to claim 1, wherein the at least one liquid includes a solvent.

17. The method according to claim 1, wherein the at least one liquid including an optoelectronic material is a suspension.

18. The method according to claim 1, wherein the step of drying the at least one layer of the liquid forms an emitter layer and the method further comprises:
    forming an electrode such that the electrode contacts the emitter layer.

19. A method for the production of luminous diodes, comprising the steps of:
    applying onto a substrate at least one layer of a liquid including an optoelectronic material;
    vibrating the at least one layer after applying the at least one layer onto the substrate, wherein said vibrating is effected during drying of the at least one layer of the liquid wherein said vibrating is effected during drying of the at least one layer of the liquid; and
    drying the at least one layer of the liquid.

20. The method according to claim 19, where said vibrating is effected by ultrasound.

21. A method for the production of luminous diodes, comprising the steps of:
    applying onto a substrate at least one layer of a liquid including an optoelectronic material that includes an organic electroluminescent material;
    vibrating the at least one layer after applying the at least one layer onto the substrate, wherein said vibrating is effected during drying of the at least one layer of the liquid; and
    drying the at least one layer of the liquid.

* * * * *

UNITED STATES PATENT AND TRADEMARK OFFICE
CERTIFICATE OF CORRECTION

PATENT NO. : 6,864,113 B2
DATED : March 8, 2005
INVENTOR(S) : Joerg Blaessing and Georg Wittmann It is certified that error appears in the above-identified patent and that said Letters Patent is hereby corrected as shown below:

Title page,
Item [75], Inventors, please replace "Obukochen" with -- Oberkochen --.

Column 3,
Lines 20-23, please replace "wherein said vibrating is effected during drying of the at least one layer of the liquid wherein said vibrating is effected during drying of the at least one layer of the liquid" with -- wherein said vibrating is effected during drying of the at least one layer of the liquid --.

Signed and Sealed this

Twenty-seventh Day of September, 2005

JON W. DUDAS
*Director of the United States Patent and Trademark Office*